United States Patent
Rydin

(10) Patent No.: US 6,680,649 B2
(45) Date of Patent: Jan. 20, 2004

(54) COORDINATE ROTATION OF PRE-DISTORTION VECTOR IN FEEDFORWARD LINEARIZATION AMPLIFICATION SYSTEM

(75) Inventor: Arne Rydin, Fjärdhundra (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 34 days.

(21) Appl. No.: 10/163,643

(22) Filed: Jun. 7, 2002

(65) Prior Publication Data

US 2003/0227324 A1 Dec. 11, 2003

(51) Int. Cl.[7] .............................. H03F 3/66; H03F 1/26
(52) U.S. Cl. ........................................ 330/149; 330/151
(58) Field of Search .......................... 330/10, 163, 149, 330/151

(56) References Cited

U.S. PATENT DOCUMENTS

| | | |
|---|---|---|
| 5,111,155 A | 5/1992 | Keate et al. |
| 5,770,971 A * | 6/1998 | McNicol ..................... 330/149 |
| 5,949,283 A | 9/1999 | Proctor et al. |
| 6,075,411 A | 6/2000 | Briffa et al. |
| 6,188,732 B1 | 2/2001 | Rha |

FOREIGN PATENT DOCUMENTS

| | | | |
|---|---|---|---|
| EP | 0 731 556 A | | 9/1996 |
| EP | 0 869 606 A | | 10/1998 |
| EP | 1 204 216 A | | 5/2002 |
| JP | 230636 | * | 8/2001 |
| WO | 01/31779 A1 | | 5/2001 |

OTHER PUBLICATIONS

European Search Report mailed Jan. 9, 2003 based on U.S. patent application 10/163,643.

* cited by examiner

*Primary Examiner*—Michael B Shingleton
(74) *Attorney, Agent, or Firm*—Nixon & Vanderhye, P.C.

(57) ABSTRACT

An amplifier system (120, 820) for radio frequency signals comprises a phase and gain adjuster (122) which receives an input signal and a control vector (C) for producing a distortion-adjusted input signal. The distortion-adjusted input signal is applied to a main amplifier (126) which generates an amplified output signal. A control loop generates a control vector (P) indicative of distortion of the main amplifier. A modified pre-distortion vector generator (199, 899) generates a modified pre-distortion vector (P') which is combined with the control vector to produce a composite control vector (Comp). The composite control vector is applied to the phase and gain adjuster, thereby enabling the phase and gain adjuster to produce the distortion-adjusted input signal. In essence, the modified pre-distortion vector generator performs a vector multiplication (coordinate rotation) of a pre-distortion vector so that the resultant modified pre-distortion vector has a proper direction relative to the control vector.

36 Claims, 8 Drawing Sheets

COORDINATE ROTATION OF PRE-DISTORTION VECTOR IN FEEDFORWARD LINEARIZATION AMPLIFICATION SYSTEM

BACKGROUND

This application is related to the following simultaneously-filed United States Patent Application: U.S. patent application Ser. No. 10/163,642, entitled "AUXILIARY AMPLIFIER IN FEEDFORWARD LINEARIZATION AMPLIFICATION SYSTEM"; which is incorporated herein by reference in its entirety.

FIELD OF THE INVENTION

The present invention pertains to linear amplification of RF signals, for example linear amplification of RF signals using a multicarrier amplifier.

RELATED ART AND OTHER CONSIDERATIONS

Amplifiers are typically employed to amplify RF signals in order to provide, e.g., increased power for transmission purposes, particularly transmission over an air interface to a receiver such as (for example) a mobile station (e.g., a user equipment unit (UE) such as a cell phone). But in amplifying an input RF signal, the amplifier may add unwanted components due to non-linear characteristics of the amplifier. Such is particularly true when the type of amplifier utilized is chosen for its power efficiency and/or when plural continuous wave RF input signals are applied to the amplifier. Rather than just producing amplified signals corresponding input signals, such amplifier may also output certain additional signals related to the frequencies of the input signals. In this regard, mathematically the output of the amplifier can be expressed as a DC term; a fundamental term (which includes nominal gain for the input signals and an amplitude distortion); and (typically second and third) harmonics terms. The DC term and harmonics can usually be filtered out rather easily, leaving a passband.

The distortion within the passband is not easily removed, but rather is minimized by designing the overall amplifier system in order to compensate for the non-linear characteristics of the amplifier component per se. Such "linearization" of an amplifier system is important in order to avoid distorted signal trajectories and to avoid errors in determining the logic level of individual digital signals.

There are many techniques that can be used to linearize amplifiers. Among the linearization techniques are the following: Back off (in the case of Class A amplifiers); Feedforward; Vector summation; Predistortion, and Feedback. Several of these linearization techniques are briefly described in U.S. Pat. No. 6,075,411 to Briffa et al., which is incorporated herein by reference in its entirety. See also, in this regard, Briffa, Mark, "Linearisation of RF Power Amplifiers,", 1996.

The feedforward technique is advantageous for broadband linear RF amplifier systems. As mentioned briefly above, since the multicarrier input signal is distorted by the non-linearities in the main amplifier, certain intermodulation (IM) products appear at the output. In essence, the feedforward technique generates an error signal by comparing the input signal with the main amplifier output. The error signal is subtracted from the main amplifier output, leaving a (nearly) distortion-free amplified signal.

FIG. 1 illustrates a simplified, example amplifier system 20 which employs a feedforward technique to minimize distortion. The amplifier system 20 comprises a phase and gain adjuster 22 which receives, via coupler 24, an input signal. Output from the phase and gain adjuster 22 is applied to main power amplifier 26. Output from main power amplifier 26 is applied to a coupler 28, and from one leg of coupler 28 via attenuator 30 to subtractor 32. Both subtractor 32 and first loop controller 34 receive, via delay 36, the input signal as obtained from coupler 24. Output from subtractor 32 is applied both to first loop controller 34 and to a second gain and phase adjuster 40. Output from gain and phase adjuster 40 is applied to auxiliary amplifier 42, whose amplified output is coupled by coupler 44 to line 46. Line 46 emanates from coupler 28 and delay 48. The output signal carried on line 46 at point 51 is applied via coupler 50 and attenuator 52 to third loop controller 54, with third loop controller 54 connected to control gain and phase adjuster 40.

Being in a simplified form for sake of illustration, the amplifier system 20 of FIG. 1 comprises three loops. A first loop of amplifier system 20 includes phase and gain adjuster 22, main power amplifier 26, coupler 28, attenuator 30, and subtractor 32. If the gain and phase shift through phase and gain adjuster 22, main power amplifier 26, and attenuator 30 equals the gain and phase shift through delay 36, an error signal indicative of the distortion of main power amplifier 26 is output by subtractor 32. But in order to equalize gain and phase shift through these paths, first loop controller 34 is used to produce control signals, applied on line 60, to phase and gain adjuster 22.

A second loop of amplifier system 20 comprises attenuator 30, subtractor 32, gain and phase adjuster 40, auxiliary amplifier 42, coupler 44, and delay 48. If the gain and phase shift through attenuator 30, subtractor 32, gain and phase adjuster 40, and auxiliary amplifier 42 equals the gain and phase shift through delay 48, except for a 180 degree phase shift, the distortion is added in opposite phase at coupler 44, thus canceling out the distortion of main power amplifier 26 on line 46. A third loop including attenuator 52 and third loop controller ensures phase and gain equality in these two paths.

Thus, the first loop described above with reference to amplifier system 20 creates an error signal which contains the intermodulation distortion from the main power amplifier 26. The second loop serves to cancel intermodulation distortion at output point 51, while leaving the carriers unaffected.

If the intermodulation distortion could be reduced in the main amplifier, the demands on the feedforward system would be lowered. For example, the error amplifier, e.g., auxiliary amplifier 42 in FIG. 1, must be dimensioned to handle the total intermodulation power. With less intermodulation power, a smaller error amplifier with a lower power consumption could be used, leading to higher efficiency of the overall amplifier system.

Accordingly, some amplifier systems which employ the feedforward technique also introduce a predistortion that is the reverse of the non-linearities of the main amplifier. FIG. 2 illustrates an example use of pre-distortion in a system such as that described above. The system of FIG. 2 basically involves addition of a pre-distortion circuit 80, as well as an additional phase and gain adjuster 22'. The additional phase and gain adjuster 22' is added in series with the first gain and phase adjuster 22 (which can be a Cartesian gain and phase adjuster). The person skilled in the art knows how to construct and use a suitable pre-distortion circuit, for example with reference to U.S. Pat. No. 6,075,411 to Briffa et al., which is incorporated herein by reference in its entirety.

At high output levels, the gain of a power amplifier (such as power amplifier 26 in FIG. 2) may decrease due to compression. A purpose of predistortion is to add (complex) gain in signal path before the power amplifier in order to compensate for the decrease of gain in the power amplifier.

The pre-distortion gain and phase adjuster 22' has the normalized transfer function $1+i_p(x)+jq_p(x)$, where $i_p(x)+jq_p(x)=P(x)$ is the pre-distortion vector provided by pre-distortion circuit 80. The functions $i_p(x)$ and $q_p(x)$ are signal dependent and are in most cases polynomials. The combined output (seen at the output of pre-distortion gain and phase adjuster 22') is provided by Expression 1.

$$y(t)=x(t)\,((i_c+jq_c)(1+i_p(x)+jq_p(x))) \qquad \text{(Expression 1)}$$

It would, however, be convenient if the pre-distortion signal output by pre-distortion circuit 80 were added in the first Cartesian phase and gain adjuster 22, rather than in pre-distortion gain and phase adjuster 22'. FIG. 3 shows such an attempted implementation, with part of the input signal (obtained via coupler 82) and certain coefficients being used by pre-distortion circuit 80 to generate a pre-distortion vector P. In such case it would appear that the pre-distortion vector P is to be added by an adder 84 to the loop control vector C output by first loop controller 34, with the addition performed by adder 84 giving a composite control vector Comp which is applied to phase and gain adjuster 22.

In graphical form, the composite control vector Comp is illustrated by the right-most vector in FIG. 4. The corresponding output of gain and phase adjuster 22 is as indicated in Expression 2.

$$y(t)=x(t)((i_c+i_p(x))+j(q_c+q_p(x))) \qquad \text{(Expression 2)}$$

As it turns out, however, the phase shift through phase and gain adjuster 22, main power amplifier 26, and attenuator 30 in the FIG. 3 implementation is typically about 10 to about 20 full 360 degree turns, and only small variations in power and amplifier characteristics produce considerable phase changes.

In the situation depicted in the first quadrant of FIG. 4, the total complex gain of the vector sum Comp (Comp is the vector sum of vector C and vector P) is higher than the vector C. But the vector C is prone to change, such change occurring when the phase of the signal path which includes the power amplifier changes (due, for example, to such factors as temperature changes). Since the first loop controller 34 adapts to these changes, the control vector C may rotate to an extent that it falls in another quadrant (for example as illustrated by the left-most vector C in the second quadrant in FIG. 4). The pre-distortion vector P will then have a wrong direction relative to C, with the result that pre-distortion vector P cannot be directly applied to phase and gain adjuster 22 under such circumstances. Rather, the vector P has to be changed to give the desired higher gain. An extreme situation occurs in the third quadrant wherein the vectors C and P have opposing directions, with the incorrect result that the vector sum Comp is actually shorter than vector C.

What is needed, therefore, and an object of the present invention, is a technique for rendering the pre-distortion vector P usable by a phase and gain adjuster of a feedforward amplifier system.

BRIEF SUMMARY

An amplifier system for radio frequency signals comprises a phase and gain adjuster which receives an input signal and a control vector for producing a distortion-adjusted input signal. The distortion-adjusted input signal is applied to a main amplifier which generates an amplified output signal. A control loop generates a control vector indicative of distortion of the main amplifier. A modified pre-distortion vector generator generates a modified pre-distortion vector which is combined with the control vector to produce a composite control vector. The composite control vector is applied to the phase and gain adjuster, thereby enabling the phase and gain adjuster to produce the distortion-adjusted input signal. In essence, the modified pre-distortion vector generator performs a vector multiplication (e.g., coordinate rotation) of a pre-distortion vector so that the resultant modified pre-distortion vector has a proper direction relative to the control vector.

In one example, non-limiting embodiment, the modified pre-distortion vector generator comprises both a pre-distortion circuit and a vector multiplier. The pre-distortion circuit receives the input signal and pre-distortion coefficients and produces a pre-distortion vector. The vector multiplier multiplies the pre-distortion vector output by the pre-distortion circuit and the control vector to generate the modified pre-distortion vector. An adder adds the modified pre-distortion vector and the control vector to produce the composite control vector. Advantageously, the composite control vector can be directly applied to the phase and gain adjuster.

An example specific implementation of the vector multiplier embodiment, the vector multiplier comprises plural multiplier elements, including a first multiplier, a second multiplier, a third multiplier, a fourth multiplier, a subtractor, and an adder. Given the fact that the control vector has components $i_c$ and $q_c$ and the pre-distortion vector has components i and $q_p$, the first multiplier multiplies $i_c$ and $i_p$; the second multiplier multiplies $q_c$ and $q_p$; the third multiplier multiplies $i_c$ and $q_p$; and the fourth multiplier multiplies $q_c$ and $q_p$. A product of the first multiplier and a product of the second multiplier are applied to the subtractor, whereas a product of the third multiplier and a product of the fourth multiplier are applied to the adder. Outputs of the subtractor and adder are applied to the adder which combines the modified pre-distortion vector and the control vector to produce the composite control vector.

In another example, non-limiting embodiment, the modified pre-distortion vector generator comprises a component vector multiplier and a pre-distortion circuit. The component vector multiplier multiplies pre-distortion coefficients by the control vector to produce modified pre-distortion coefficients. The pre-distortion circuit which receives the input signal and the modified pre-distortion coefficients to generate the modified pre-distortion vector. The modified pre-distortion vector is applied to the adder which combines the modified pre-distortion vector and the control vector to produce the composite control vector.

In the differing embodiment, the pre-distortion coefficients can be either adaptive coefficients or fixed coefficients as suits the particular application and/or environment of use.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

DETAILED DESCRIPTION OF THE DRAWINGS

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. In other instances, detailed descriptions of well-known devices, circuits, and methods are omitted so as not to obscure the description of the present invention with unnecessary detail. Moreover, individual function blocks are shown in some of the figures. Those skilled in the art will appreciate that the functions may be implemented using individual hardware circuits, using software functioning in conjunction with a suitably programmed digital microprocessor or general purpose computer, using an application specific integrated circuit (ASIC), and/or using one or more digital signal processors (DSPs).

Figure 1:
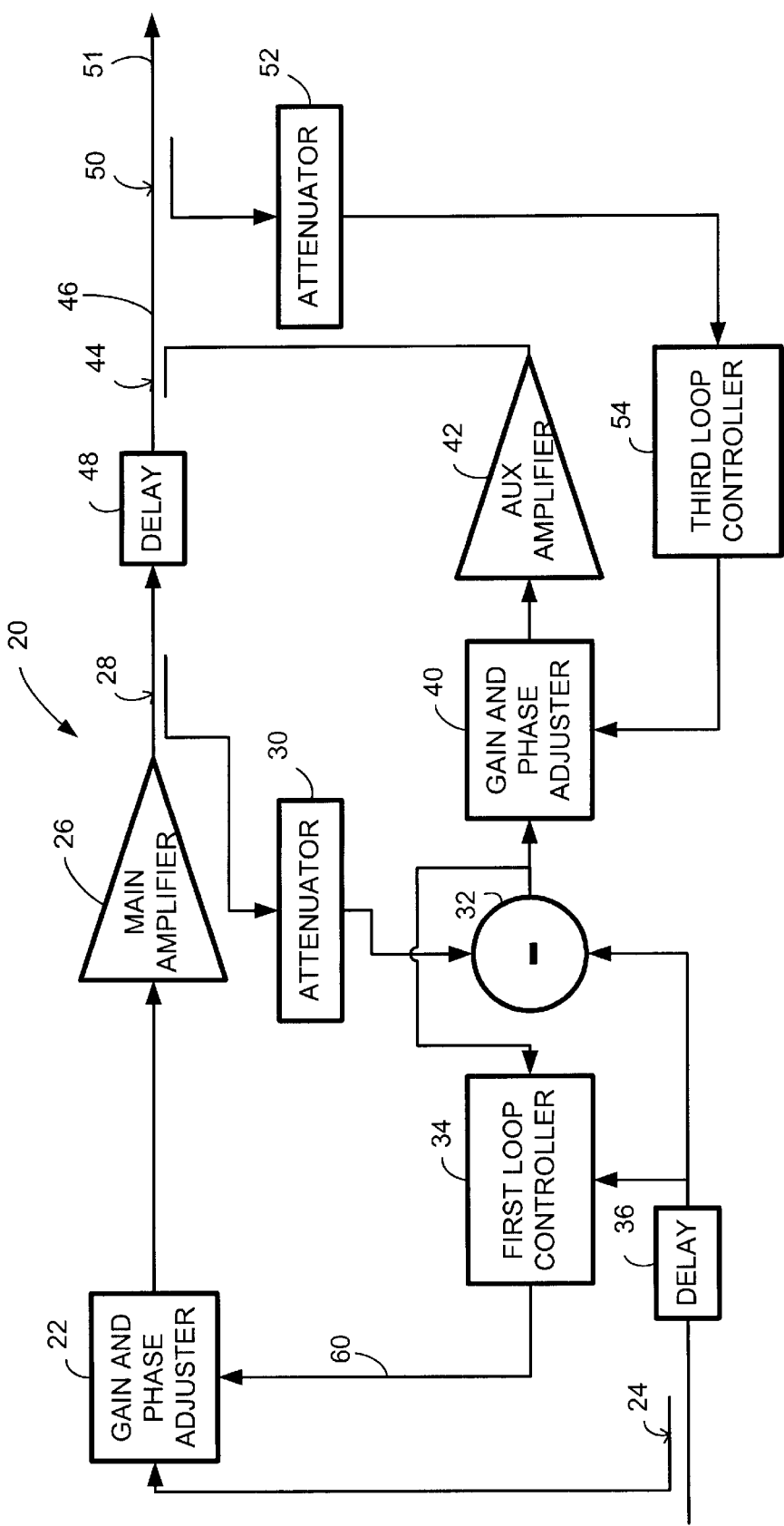
FIG. 1 is diagrammatic view of a conventional amplifier system which employs a feedforward technique.
Figure 2:
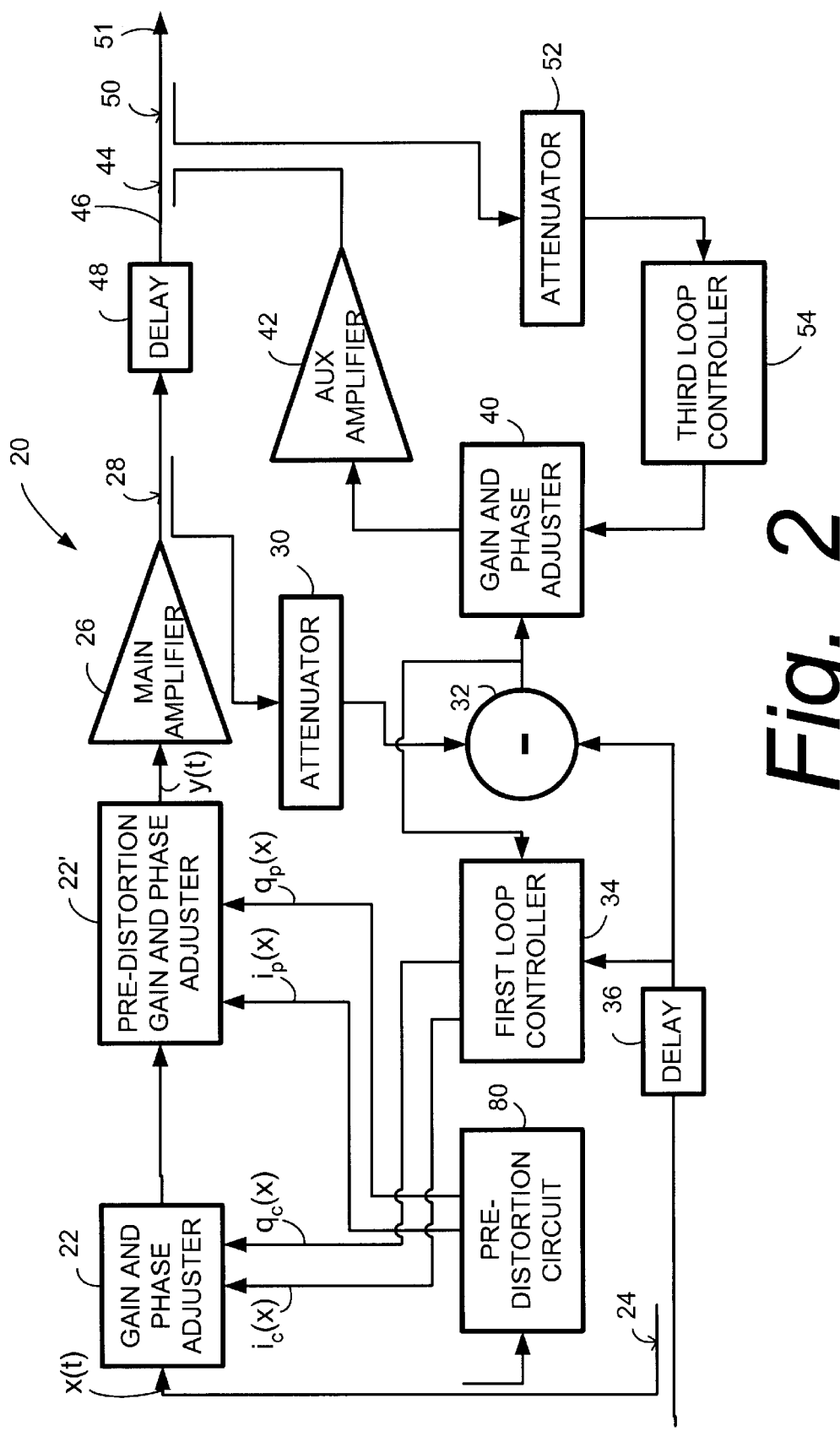
FIG. 2 is a diagrammatic view of a conventional amplifier system which employs pre-distortion in conjunction with a feedforward technique by applying a pre-distortion vector to a pre-distortion gain and phase adjuster which supplements a first loop phase and gain adjuster.
Figure 3:
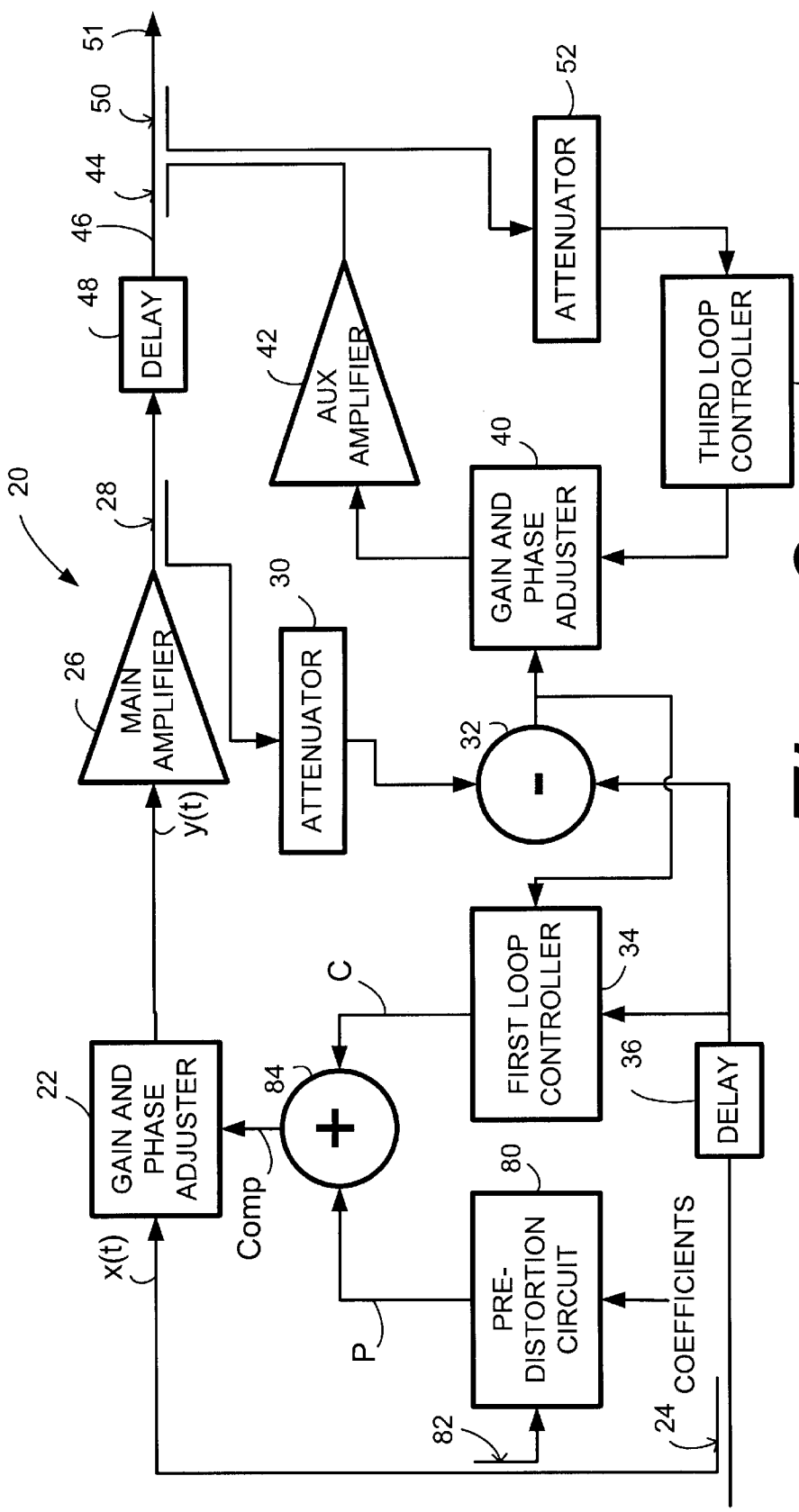
FIG. 3 is a diagrammatic view of an amplifier system which attempts to employ pre-distortion in conjunction with a feedforward technique by summing a control vector C and a pre-distortion vector P, but wherein the pre-distortion vector P can have a wrong direction relative to control vector C.
Figure 5:
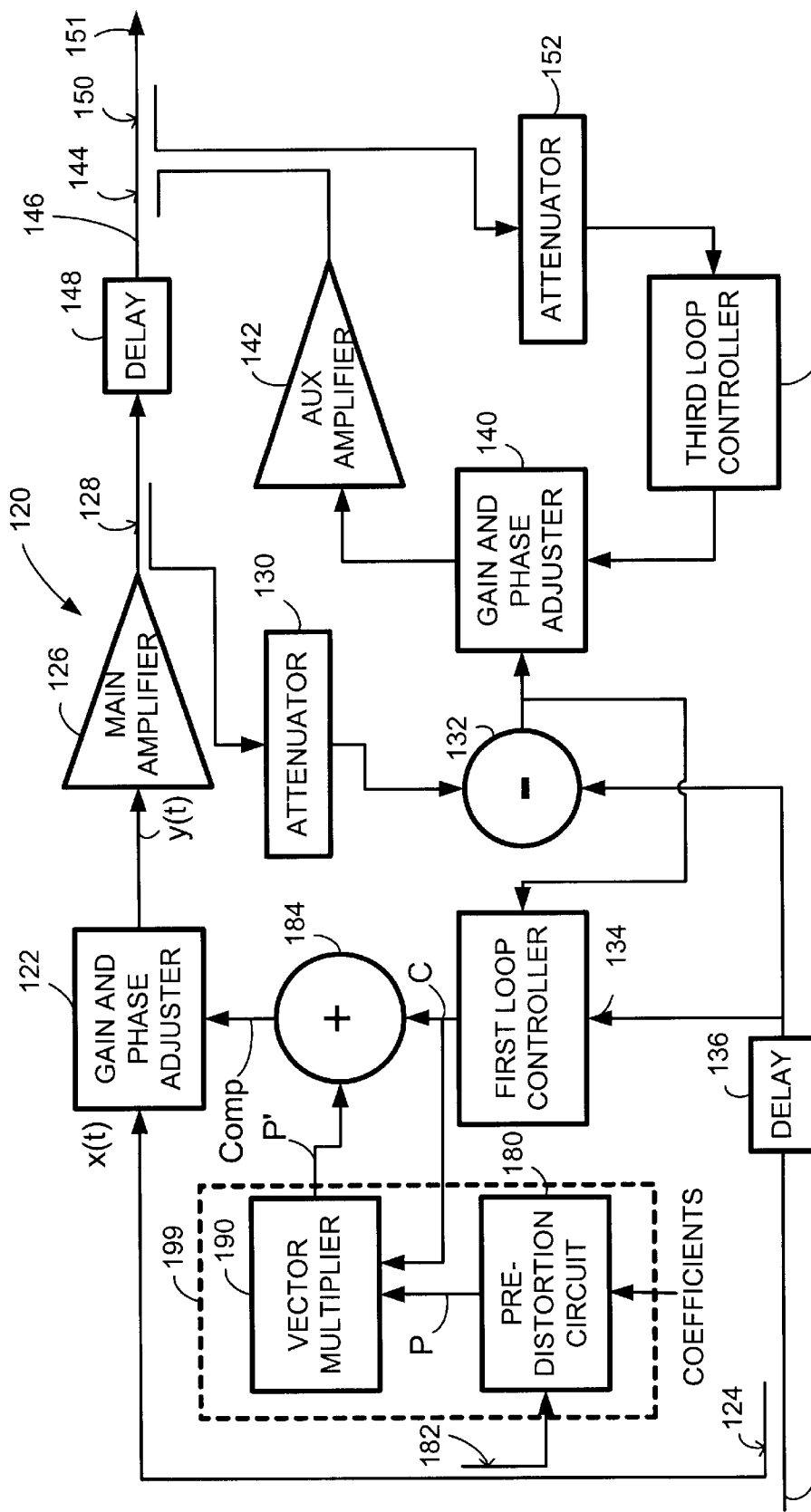
FIG. 5 is a diagrammatic view of a first example, non-limiting embodiment of an amplifier system which successfully employs pre-distortion in conjunction with a feedforward technique and wherein an adjusted or modified pre-distortion vector P has a correct direction.

In contrast to FIG. 3, FIG. 5 shows an example, non-limiting implementation of an amplifier system 120 which successfully employs pre-distortion in conjunction with a feedforward technique so that its adapted or modified pre-distortion vector P' has a correct direction relative to control vector C. Elements of amplifier system 120 which are analogous to corresponding elements of amplifier system 20 of FIG. 3 have similarly numbered lower order digits for their reference numerals. As with the amplifier system 20 of FIG. 3, the amplifier system 120 of FIG. 5 has three loops which serve comparable functions to the corresponding three loops of amplifier system 20.

The amplifier system 120 of FIG. 5 comprises a phase and gain adjuster 122. Phase and gain adjuster 122 is connected, via coupler 124, to receive an input signal applied at point 121. On its output side phase and gain adjuster 122 is connected to an input side of main power amplifier 126. The output side of main power amplifier 126 is applied to coupler 128, and from one leg of coupler 128 via attenuator 130 to subtractor 132. The attenuator 130 reduces the gain of the signal output by main power amplifier 126 by an amount corresponding to the gain provided by main power amplifier 126.

Both subtractor 132 and controller 134 (also known as a first controller) receive, via delay 136, the input signal from point 121. An output side of subtractor 132 is connected both to an input of first loop controller 134 and to a second gain and phase adjuster 140. An output side of gain and phase adjuster 140 is connected to an input side of auxiliary amplifier 142. The amplified output of auxiliary amplifier 142 is coupled by coupler 144 to line 146. Line 146 is connected via delay 148 and coupler 128 to the output side of main power amplifier 126.

The output signal carried on line 146 at point 151 is applied via coupler 150 and attenuator 152 to third loop controller 154. The third loop controller 154 is connected to control gain and phase controller 140.

A first loop of amplifier system 120 includes phase and gain adjuster 122, main power amplifier 126, coupler 128, attenuator 130, and subtractor 132. The subtractor 132 compares the attenuated output of main power amplifier 126 with the input signal acquired via delay 136. The length of delay afforded by delay 136 corresponds to the delay through phase and gain adjuster 122, main power amplifier 126, and attenuator 130. If the gain and phase shift through phase and gain adjuster 122, main power amplifier 126, and attenuator 130 equals the gain and phase shift through delay 136, an error signal indicative of the distortion of main power amplifier 126 is output by subtractor 132. Fine adjustment of the amplitude and phase matching is performed by phase and gain adjuster 122.

The first loop controller 134 is connected to receive the input signal applied at point 121 (received via coupler 124 and delay 136) and the error signal generated by subtractor 132. The first loop controller 134 generates a control vector C, which is applied both to a first input side of adder 184 and to a first input side of vector multiplier 190.

A second loop of amplifier system 120, which serves as a distortion compensation circuit, comprises attenuator 130, subtractor 132, gain and phase controller 140, auxiliary amplifier 142, coupler 144, and delay 148. If the gain and phase shift through attenuator 130, subtractor 132, gain and phase controller 140, and auxiliary amplifier 142 on the one hand equals the gain and phase shift through delay 148 on the other hand, except for a 180 degree phase shift, the distortion is added in opposite phase at coupler 144, thus canceling out the distortion of main power amplifier 126 on line 146.

To ensure phase and gain equality in the path on line 146 and the path through attenuator 130, subtractor 132, gain and phase controller 140, and auxiliary amplifier 142, controller 154 generates control signals which are applied to gain and phase adjuster 140. In this regard, as a third loop, controller 154 uses the signal at point 151, reduced by attenuator 152, to generate the control signals applied to gain and phase controller 140.

The phase and gain adjuster 122 can be a Cartesian phase and gain adjuster. For example, the phase and gain adjuster 122 can be a quadrature gain phase adjuster (QGPA) such as that described in U.S. Pat. No. 6,075,411 to Briffa et al., which is incorporated herein by reference in its entirety.

Owing to coupler 182, the input signal is applied both to phase and gain adjuster 122 and to an input side of pre-distortion circuit 180. The pre-distortion circuit 180 generates a pre-distortion vector P in accordance with conventional practice such as that described, e.g., in U.S. Pat. No. 6,075,411 to Briffa et al., which again is incorporated herein by reference in its entirety.

In essence, the pre-distortion circuit 180 comprises two polynomial function generators which respectively generate in-phase and quadrature signals for pre-distortion vector P. The two polynomial function generators generate the signals based on the received input signal as well as certain coefficients which are input to pre-distortion circuit 180. The person skilled in the art will appreciate how such coefficients are generated and applied to pre-distortion circuit 180, realizing that the values of the coefficients can be either fixed or adaptive and that the values of the coefficients are derived from the output of the main amplifier which is being linearlized. For example, such coefficients can be generated by a controller or processor or the like in order to minimize distortion and thus the level of intermodulation products present in the (filtered) output of the main amplifier.

In the amplifier system of FIG. 5, the pre-distortion circuit 180 forms part of a modified pre-distortion vector generator 199. In the modified pre-distortion vector generator 199, the pre-distortion vector P output by pre-distortion circuit 180 is applied to a second input side of vector multiplier 190. The vector multiplier 190 also comprises the modified pre-distortion vector generator 199 of the embodiment of FIG. 5. The vector multiplier 190 outputs a modified or adjusted pre-distortion vector P' which is applied to a second input side of adder 184. The adder 184 adds the adjusted pre-distortion vector P' obtained from vector multiplier 190 to the loop control vector C output by first loop controller 134, thereby generating a composite control vector Comp which is applied to phase and gain adjuster 122.

Thus, the modified pre-distortion vector generator 199 generates a modified pre-distortion vector P'. The modified pre-distortion vector P' is combined with (e.g., added to) the control vector C to produce the composite control vector Comp. Advantageously, the composite control vector can be applied directly to the phase and gain adjuster 122 (rather than applied to a separate or auxiliary phase and gain adjuster).

In the FIG. 5 embodiment, the modification or adjustment of the pre-distortion vector P which is performed by modified pre-distortion vector generator 199 is attributable primarily to vector multiplier 190, which outputs the modified pre-distortion vector P'. The modified pre-distortion vector P' is expressed as $P'(x)=i_p'(x)+jq_p'(x)$. Insertion of the modified pre-distortion vector P' into Expression 2 gives Expression 3.

$$y(t)=x(t)((i_c+i_p'(x))+j(q_c+q_p'(x))) \quad \text{(Expression 3)}$$

Expanding expressions 1 and 3 and comparing terms gives Expressions 4 and 5, which in turn yield Expression 6.

$$i_p'(x)=i_c i_p(x)-q_c q_p(x) \quad \text{(Expression 4)}$$

$$q_p'(x)=i_c q_p(x)+q_c i_p(x) \quad \text{(Expression 5)}$$

$$P'(x)=C(x)P(x)=(i_c+jq_c)(i_p(x)+jq_p(x)) \quad \text{(Expression 6)}$$

Thus, the vector product performed by vector multiplier 190 of the control vector C and the pre-distortion vector P gives the desired modified vector P'. This means that utilization of vector multiplier 190 solves the problem of pre-distortion vector P otherwise having the wrong direction.

In essence, the vector multiplication performed by vector multiplier 190 represents a coordinate rotation for the pre-distortion vector P, so that the modified pre-distortion vector P' "follows" or rotates with the control vector C. In other words, the entire coordinate system of vector P rotates with vector C as vector C changes, so that the vector P does not have to be readjusted when vector C changes. The magnitude of the resultant sum vector Comp thus remains constant independently of where vector C falls. The angle between vector C and vector Comp also remains constant independently of where vector C falls.

Figure 4:
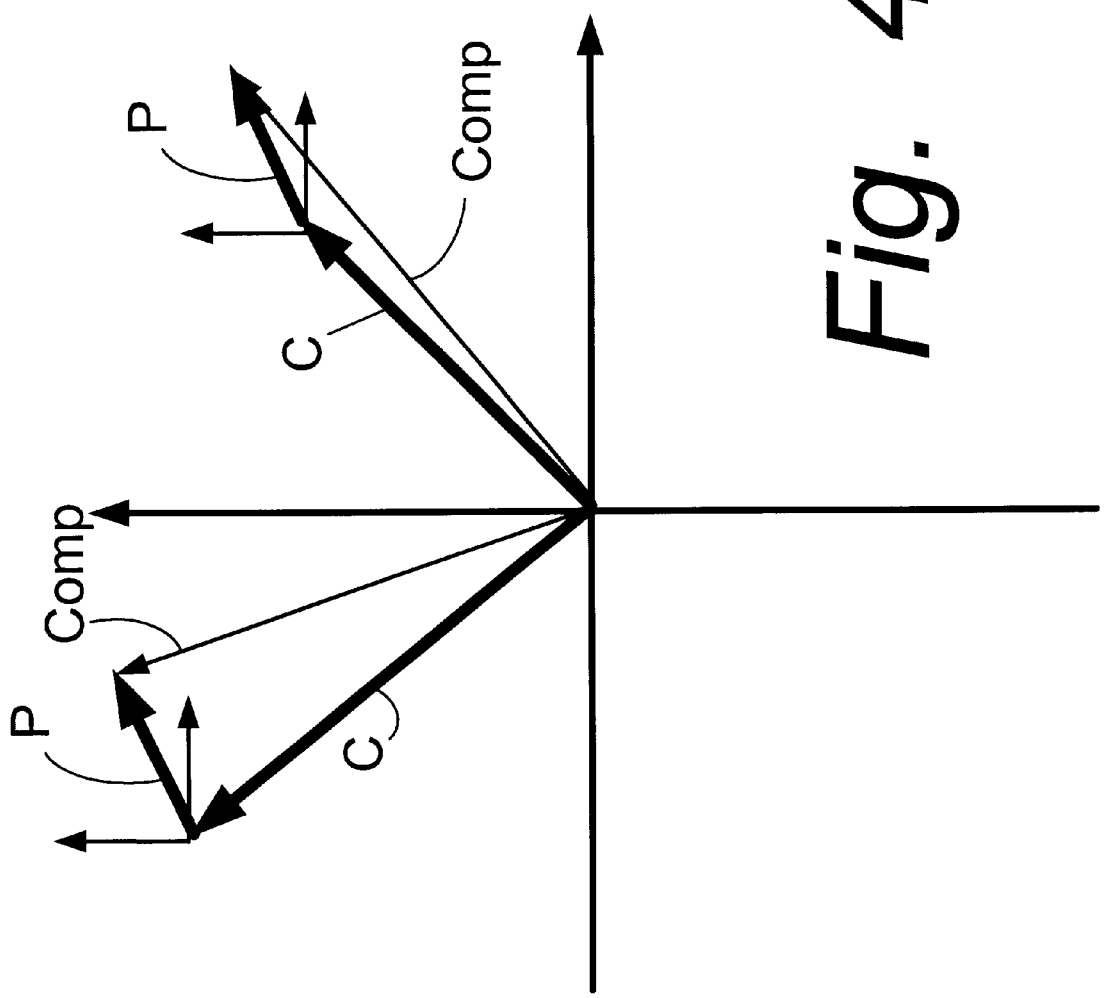
FIG. 4 is a graph which illustrates how the pre-distortion vector P of the system of FIG. 3 can have a wrong direction relative to control vector C.
Figure 6:
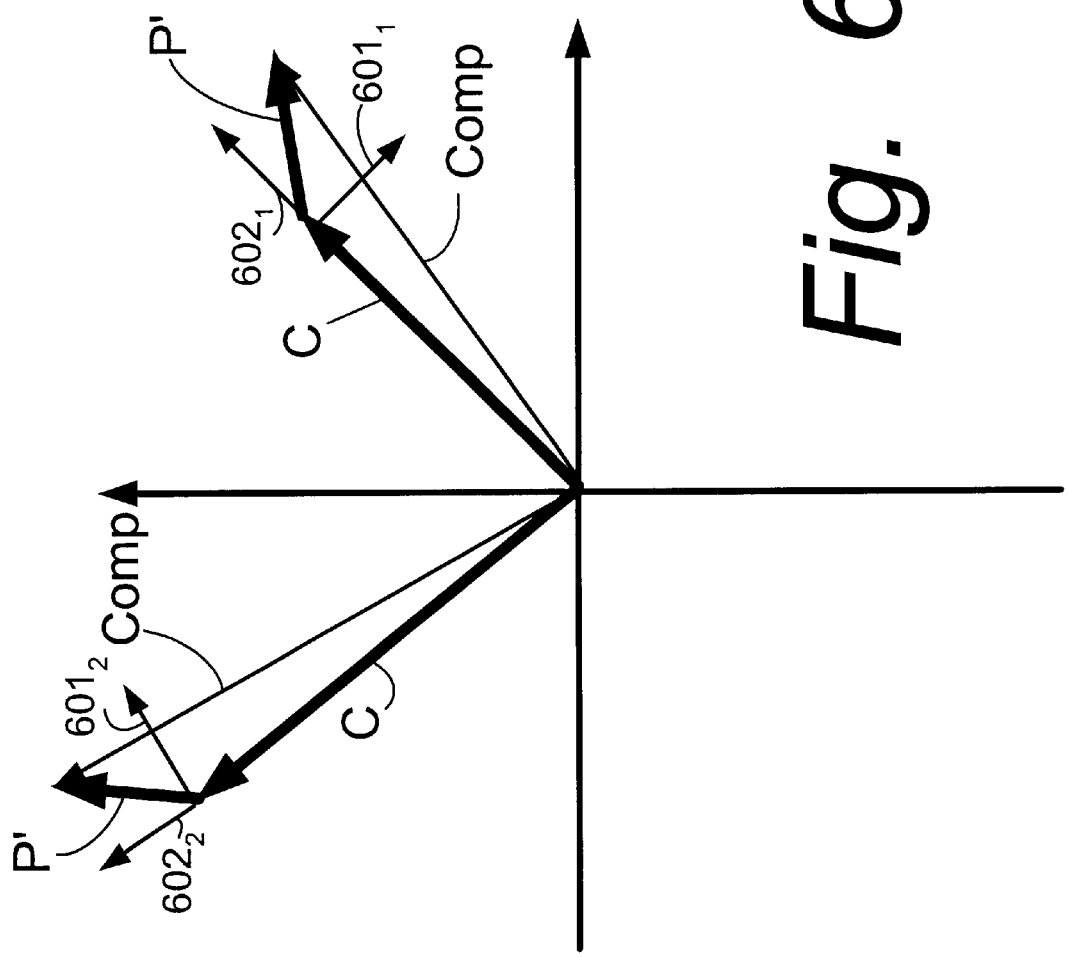
FIG. 6 is a graph which illustrates coordinate rotation of a pre-distortion vector P of the system of FIG. 5.

Such coordinate rotation and following of (e.g., rotation with) of control vector C by the modified pre-distortion vector P' is illustrated by contrasting FIG. 6 with FIG. 4. In particular, FIG. 6 shows that the axes $601_1$, $602_1$ and $601_2$, $602_2$ which form the frame of reference for modified pre-distortion vector P' are rotated relative to the analogous axes of FIG. 4.

The vector multiplication which provides the desired coordinate rotation can be performed in the analog domain, in the digital domain, or in a combination of both.

Figure 7:
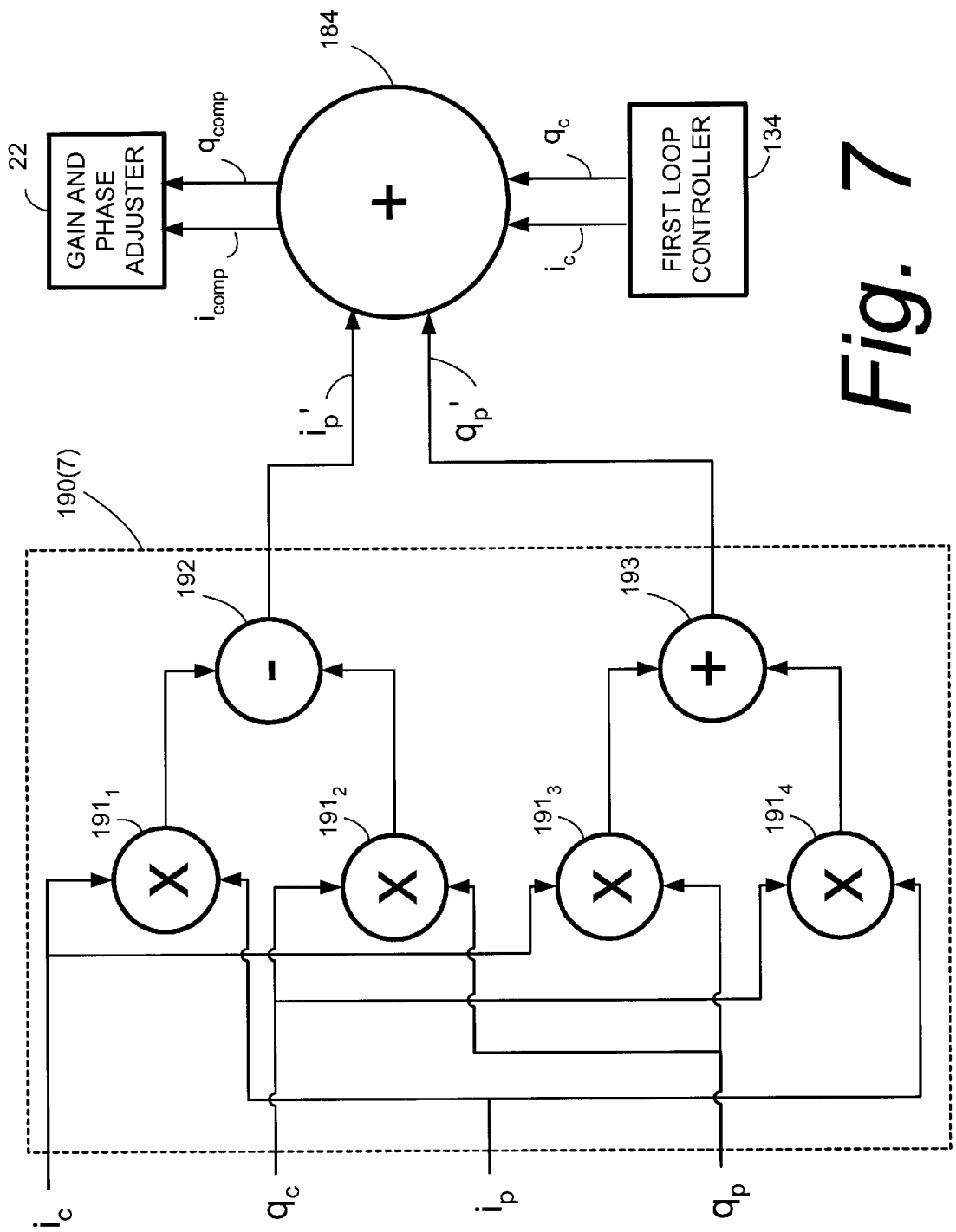
FIG. 7 is a schematic view of a vector multiplier according to an example analog implementation.

A non-limiting, example implementation of an analog vector multiplier is shown as vector multiplier 190(7) in FIG. 7. In FIG. 7, $i_p$, $q_p$, $i_c$, $q_c$, $p_c'$ and $q_c'$ denote the orthogonal components of the vectors P, C and P', respectively. The vector multiplier 190(7) of FIG. 7 comprises four multipliers $191_1$ through $191_4$; a subtractor 192; and, an adder 193.

Figure 8:
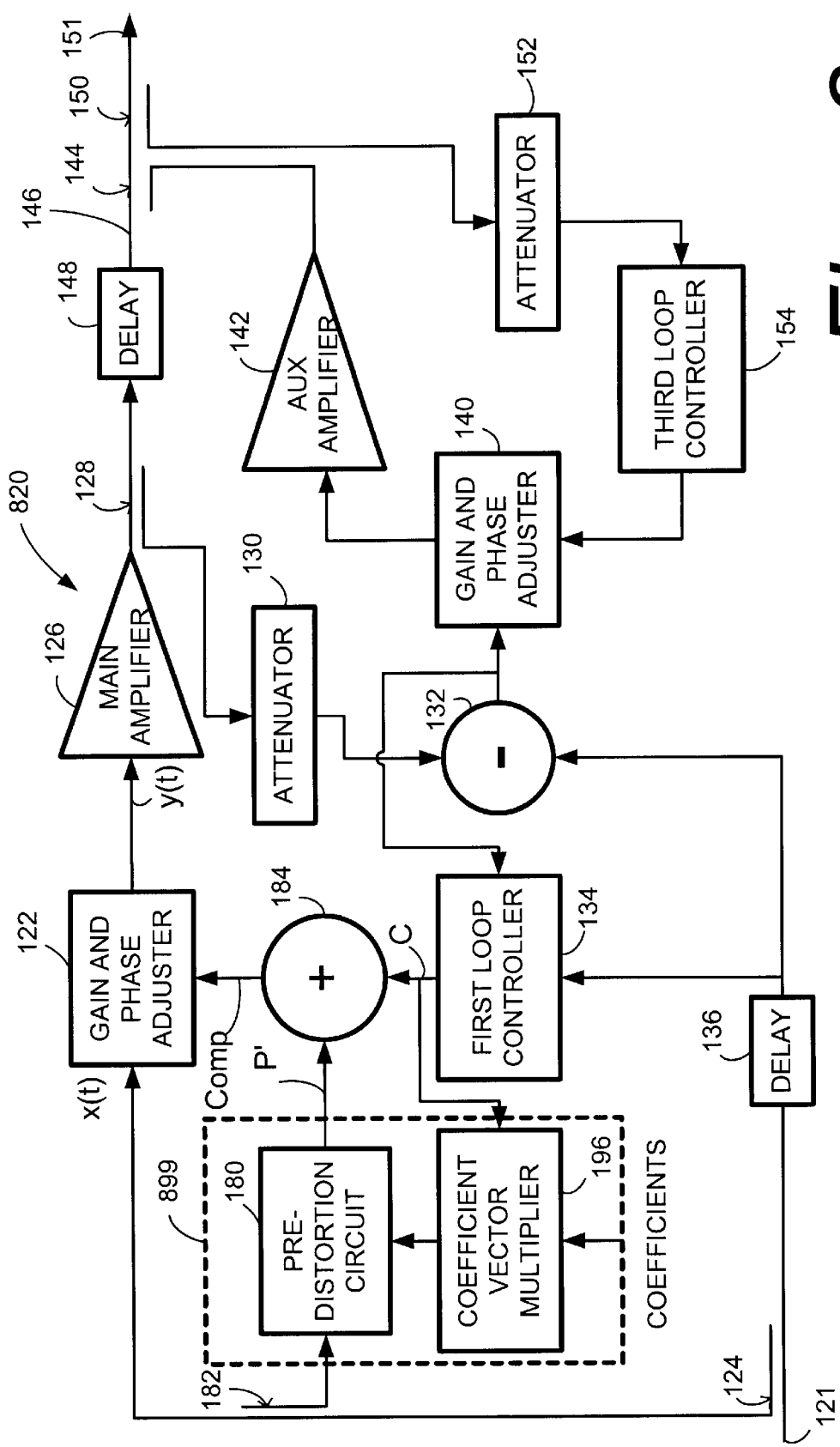
FIG. 8 is a diagrammatic view of a second example, non-limiting embodiment of an amplifier system which successfully employs pre-distortion in conjunction with a feedforward technique and wherein an adjusted or modified pre-distortion vector P has a correct direction.

FIG. 8 shows another non-limiting, example embodiment of an amplification system 820 having a modified pre-distortion vector generator 899 which provides the modified pre-distortion vector P'. Elements of amplifier system 820 which are analogous to corresponding elements of amplifier system 120 of FIG. 5 have similarly numbered lower order digits for their reference numerals.

The modified pre-distortion vector generator 899 of amplifier system 820 of FIG. 8 essentially differs from the system of FIG. 5 in not having the vector multiplier 190, but instead comprising a coefficient vector multiplier 196 together with the pre-distortion circuit 180. The output of coefficient vector multiplier 196 is applied to pre-distortion circuit 180, with the output of pre-distortion circuit 180 now being the modified pre-distortion vector P' which is applied to the second input side of adder 184. The coefficient vector multiplier 196 can be either analog or digital depending of the application.

Thus, modification of the coefficients of the pre-distortion functions i(x) and q(x) in the manner facilitated by the embodiment of FIG. 8 also gives the desired result. Let, for example (in the case of polynomials) i(x) be defined as in Expression 7 and q(x) be defined as in Expression 8.

$$i(x)=C_{i2}x^2+C_{i4}x^4+\ldots+C_{i2n}x^{2n} \quad \text{(Expression 7)}$$

$$q(x)=C_{q2}x^2+C_{q4}x^4+\ldots+C_{q2n}x^{2n} \quad \text{(Expression 8)}$$

Then, the modified coefficients will be provided by Expression 9 through Expression N.

$$C_{i2}'=i_c C_{i2}-q_c C_{q2} \quad \text{(Expression 9)}$$

$$C_{q2}'=i_c C_{q2}+q_c C_{12} \quad \text{(Expression 10)}$$

$$C_{i4}'=i_c C_{i4}-q_c C_{q4} \quad \text{(Expression 11)}$$

$$C_{q4}'=i_c C_{q4}+q_c C_{q4} \quad \text{(Expression 12)}$$

. . .

$$C_{i2n}'=i_c C_{i2n}-q_c C_{q2n} \quad \text{(Expression N-1)}$$

$$C_{q2n}'=i_c C_{q2n}+q_c C_{i2n} \quad \text{(Expression N)}$$

Thus, the amplifier system of FIG. 8 provides a modified pre-distortion vector P' which is also suitable for combination with the first control loop vector C for generating the composite control vector Comp.

It should be understood that the modified pre-distortion vector generators described herein can be structurally organized and the functions thereof implemented in manners other than those specifically illustrated herein. For example, the vector multiplier of the FIG. 5 embodiment or the coefficient vector multiplier of the FIG. 8 embodiment can be included in the pre-distortion circuits of the respective embodiments. Moreover, the modified pre-distortion vector generators can be implemented in diverse manners, including using individual hardware circuits, using software functioning in conjunction with a suitably programmed digital microprocessor or general purpose computer, using an application specific integrated circuit (ASIC), and/or using one or more digital signal processors (DSPs).

When suitable, for each of the amplifier systems thusly provided such as those described in conjunction with the preceding embodiments, fixed pre-distortion coefficients can be used for less critical applications. If adaptation is utilized, the speed requirement will be less demanding and the computational power can instead be used for more accurate calculation of the pre-distortion coefficients. The preferred embodiment is depending on the application. With analog loop control and fixed coefficients, the implementation according to FIG. 5 is likely preferable together with an analog vector multiplier. If digital adaptation of the coefficients is employed, the implementation according to FIG. 8 may be preferred.

As mentioned above, the modification of the pre-distortion functions involves coordinate system rotation. For some applications, depending of power amplifier characteristics, it may be advantageous to only rotate the pre-distortion vector without using the magnitude information of the control vector C. That is, instead of $i_c$ and $q_c$ in the vector multiplication, $\cos(\arctan(q_c/i_c))$ and $\sin(\arctan(q_c/i_c))$ are used respectively.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An amplifier system for radio frequency signals comprising:
   a phase and gain adjuster which receives an input signal and produces an adjusted signal;
   a main amplifier which receives the adjusted signal and generates an amplified output signal;
   a control loop which generates a control vector indicative of distortion of the main amplifier;
   a modified pre-distortion vector generator which generates a modified pre-distortion vector, the modified pre-distortion vector being combined with the control vector to produce a composite control vector, the composite control vector being applied to the phase and gain adjuster.

2. The apparatus of claim 1, wherein the modified pre-distortion vector generator performs a vector multiplication of a pre-distortion vector so that the modified pre-distortion vector has a proper direction relative to the control vector.

3. The apparatus of claim 1, wherein the modified pre-distortion vector generator performs a coordinate rotation of a pre-distortion vector so that the modified pre-distortion vector has a proper direction relative to the control vector.

4. The apparatus of claim 1, wherein the modified pre-distortion vector generator comprises:
   a pre-distortion circuit which receives the input signal and pre-distortion coefficients and produces a pre-distortion vector;
   a vector multiplier which multiplies the pre-distortion vector output by the pre-distortion circuit and the control vector to generate the modified pre-distortion vector.

5. The apparatus of claim 4, wherein the pre-distortion coefficients are adaptive coefficients.

6. The apparatus of claim 4, wherein the pre-distortion coefficients are fixed coefficients.

7. The apparatus of claim 4, further comprising an adder which adds the modified pre-distortion vector and the control vector to produce the composite control vector.

8. The apparatus of claim 4, wherein
   the modified pre-distortion vector generator comprises a first multiplier, a second multiplier, a third multiplier, a fourth multiplier, a subtractor, and an adder;
   wherein outputs of a first set of the multipliers are applied to the subtractor;
   wherein outputs of a second set of the multipliers are applied to the adder.

9. The apparatus of claim 8, wherein the control vector has components $i_c$ and $q_c$; wherein the pre-distortion vector has components $i_p$ and $q_p$;
   wherein the first multiplier multiplies $i_c$ and $i_p$;
   wherein the second multiplier multiplies $q_c$ and $q_p$;
   wherein the third multiplier multiplies $i_c$ and $q_p$;
   wherein the fourth multiplier multiplies $q_c$ and $q_p$;
   wherein a product of the first multiplier and a product of the second multiplier are applied to the subtractor; and
   wherein a product of the third multiplier and a product of the fourth multiplier are applied to the adder.

10. The apparatus of claim 1, wherein the modified pre-distortion vector generator comprises:
    a vector multiplier which multiplies pre-distortion coefficients by the control vector to produce modified pre-distortion coefficients;
    a pre-distortion circuit which receives the input signal and the modified pre-distortion coefficients to generate the modified pre-distortion vector.

11. The apparatus of claim 10, wherein the pre-distortion coefficients are adaptive coefficients.

12. The apparatus of claim 10, wherein the pre-distortion coefficients are fixed coefficients.

13. In an amplifier system for radio frequency signals, a method comprising:
    receiving an input signal at a phase and gain adjuster and using the phase and gain adjuster for producing an adjusted signal;
    applying the adjusted signal to a main amplifier and using the main amplifier for generating an amplified output signal;
    generating a control vector indicative of distortion of the main amplifier;
    generating a modified pre-distortion vector and combining the modified pre-distortion vector with the control vector to produce a composite control vector;
    applying the composite control vector to the phase and gain adjuster.

14. The method of claim 13, wherein the step of generating the modified pre-distortion vector involves performing a vector multiplication of a pre-distortion vector so that the modified pre-distortion vector has a proper direction relative to the control vector.

15. The method of claim 13, wherein the step of generating the modified pre-distortion vector involves performing a coordinate rotation of a pre-distortion vector so that the modified pre-distortion vector has a proper direction relative to the control vector.

16. The method of claim 13, wherein the step of generating the modified pre-distortion vector comprises:

receiving which receives the input signal and pre-distortion coefficients at a pre-distortion circuit and using the pre-distortion circuit for producing a pre-distortion vector;

multiplying the pre-distortion vector produced by the pre-distortion circuit and the control vector to generate the modified pre-distortion vector.

17. The method of claim 16, wherein the pre-distortion coefficients are adaptive coefficients.

18. The method of claim 16, wherein the pre-distortion coefficients are fixed coefficients.

19. The method of claim 16, further comprising using an adder to add the modified pre-distortion vector and the control vector to produce the composite control vector.

20. The method of claim 16, further comprising configuring the modified pre-distortion vector generator to comprise a first multiplier, a second multiplier, a third multiplier, a fourth multiplier, a subtractor, and an adder;

applying outputs of a first set of the multipliers to the subtractor;

applying outputs of a second set of the multipliers to the adder.

21. The method of claim 20, wherein the control vector has components $i_c$ and $q_c$; wherein the pre-distortion vector has components $i_p$ and $q_p$; and wherein the method further comprises using the first multiplier to multiply $i_c$ and $i_p$;

using the second multiplier to multiply $q_c$ and $q_p$;

using the third multiplier to multiply $i_c$ and $q_p$;

using the fourth multiplier to multiply $q_c$ and $q_p$;

applying a product of the first multiplier and a product of the second multiplier to the subtractor; and applying a product of the third multiplier and a product of the fourth multiplier to the adder.

22. The method of claim 13, wherein the step of generating the modified pre-distortion vector comprises:

multiplying pre-distortion coefficients by the control vector to produce modified pre-distortion coefficients;

using a pre-distortion circuit which receives the input signal and the modified pre-distortion coefficients for generating the modified pre-distortion vector.

23. The method of claim 22, wherein the pre-distortion coefficients are adaptive coefficients.

24. The method of claim 22, wherein the pre-distortion coefficients are fixed coefficients.

25. An amplifier system for radio frequency signals comprising:

a phase and gain adjuster which receives an input signal and produces a distortion-adjusted input signal;

a main amplifier which receives the adjusted signal and generates an amplified output signal;

means for generating a modified pre-distortion vector, the modified pre-distortion vector being combined with a control vector indicative of distortion of the main amplifier to produce a composite control vector, the composite control vector being applied to the phase and gain adjuster and used by the phase and gain adjuster applies to produce the distortion-adjusted input signal.

26. The apparatus of claim 25, wherein the means for generating a modified pre-distortion vector performs a vector multiplication of a pre-distortion vector so that the modified pre-distortion vector has a proper direction relative to the control vector.

27. The apparatus of claim 25, wherein the means for generating a modified pre-distortion vector performs a coordinate rotation of a pre-distortion vector so that the modified pre-distortion vector has a proper direction relative to the control vector.

28. The apparatus of claim 25, wherein the means for generating a modified pre-distortion vector comprises:

a pre-distortion circuit which receives the input signal and pre-distortion coefficients and produces a pre-distortion vector;

a vector multiplier which multiplies the pre-distortion vector output by the pre-distortion circuit and the control vector to generate the modified pre-distortion vector.

29. The apparatus of claim 28, wherein the pre-distortion coefficients are adaptive coefficients.

30. The apparatus of claim 28, wherein the pre-distortion coefficients are fixed coefficients.

31. The apparatus of claim 28, further comprising an adder which adds the modified pre-distortion vector and the control vector to produce the composite control vector.

32. The apparatus of claim 28, wherein the means for generating a modified pre-distortion vector comprises a first multiplier, a second multiplier, a third multiplier, a fourth multiplier, a subtractor, and an adder;

wherein outputs of a first set of the multipliers are applied to the subtractor;

wherein outputs of a second set of the multipliers are applied to the adder.

33. The apparatus of claim 32, wherein the control vector has components $i_c$ and $q_c$; wherein the pre-distortion vector has components $i_p$ and $q_p$;

wherein the first multiplier multiplies $i_c$ and $i_p$;

wherein the second multiplier multiplies $q_c$ and $q_p$;

wherein the third multiplier multiplies $i_c$ and $q_p$;

wherein the fourth multiplier multiplies $q_c$ and $q_p$;

wherein a product of the first multiplier and a product of the second multiplier are applied to the subtractor; and wherein a product of the third multiplier and a product of the fourth multiplier are applied to the adder.

34. The apparatus of claim 25, wherein the means for generating a modified pre-distortion vector comprises:

a vector multiplier which multiplies pre-distortion coefficients by the control vector to produce modified pre-distortion coefficients;

a pre-distortion circuit which receives the input signal and the modified pre-distortion coefficients to generate the modified pre-distortion vector.

35. The apparatus of claim 34, wherein the pre-distortion coefficients are adaptive coefficients.

36. The apparatus of claim 34, wherein the pre-distortion coefficients are fixed coefficients.

* * * * *